(12) United States Patent
Al-Aqeeli et al.

(10) Patent No.: US 9,670,375 B1
(45) Date of Patent: Jun. 6, 2017

(54) CRUMB RUBBER COATING WITH A HYDROPHOBIC SURFACE

(71) Applicant: KING FAHD UNIVERSITY OF PETROLEUM AND MINERALS, Dhahran (SA)

(72) Inventors: Nasser Al-Aqeeli, Dhahran (SA); Muhammad Ashraf Gondal, Dhahran (SA); Hamoud Al-Hajri, AlKhobar (SA); Atef Al-Zahrani, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 14/984,920

(22) Filed: Dec. 30, 2015

(51) Int. Cl.
*C09D 117/00* (2006.01)
*C09D 163/00* (2006.01)
(Continued)

(52) U.S. Cl.
CPC .......... *C09D 117/00* (2013.01); *C09D 5/1675* (2013.01); *C09D 5/1693* (2013.01);
(Continued)

(58) Field of Classification Search
CPC C09D 163/00; C09D 119/003; C09D 117/00; C09D 179/02; C09D 5/1693; C09D 5/1675; C08K 5/17; C08L 17/00; C08L 19/003; C08L 63/00; C08G 59/5006; C23C 16/24
See application file for complete search history.

(56) References Cited

U.S. PATENT DOCUMENTS 3,132,115 A   5/1964 Pschorr et al.
4,605,570 A   8/1986 Felter et al.
(Continued)

FOREIGN PATENT DOCUMENTS

CN   103030828   *   4/2013
JP   2008-214566  *  12/2008
(Continued)

OTHER PUBLICATIONS

Machine translation of CN 103030828, retrieved Aug. 4, 2016.*
(Continued)

*Primary Examiner* — Michael B Nelson
(74) *Attorney, Agent, or Firm* — Oblon, McClelland, Maier & Neustadt, L.L.P.

(57) ABSTRACT

A recycled crumb rubber coating with a hydrophobic surface and a method for making the same. The coating with a hydrophobic surface includes a recycled crumb rubber coating layer comprising about 24-50 wt % of a crumb rubber, and about 25-75 wt % of an epoxy comprising a liquid epoxy resin and an epoxy hardener, and a first silane film comprising at least one silane and disposed on a surface of the recycled crumb rubber coating layer to form the hydrophobic surface. The method includes (a) mixing a crumb rubber with a liquid epoxy resin to form a first mixture, (b) mixing the first mixture with an epoxy hardener to form a recycled crumb rubber coating layer, and (c) depositing a first silane film comprising at least one silane on a surface of the recycled crumb rubber coating layer to form the hydrophobic surface of the recycled crumb rubber coating.

18 Claims, 2 Drawing Sheets

(51) Int. Cl.
C09D 179/02 (2006.01)
C09D 5/16 (2006.01)
C23C 16/24 (2006.01)

(52) U.S. Cl.
CPC ......... *C09D 163/00* (2013.01); *C09D 179/02* (2013.01); *C23C 16/24* (2013.01)

(56) References Cited

U.S. PATENT DOCUMENTS

| 8,853,303 | B2 | 10/2014 | Al-Aqeeli et al. | |
|---|---|---|---|---|
| 2002/0074696 | A1* | 6/2002 | Wu | C08F 8/32 264/446 |
| 2004/0030053 | A1* | 2/2004 | Izumoto | C08J 11/06 525/326.1 |
| 2014/0316031 | A1* | 10/2014 | Al-Aqeeli | C09D 117/00 523/438 |

FOREIGN PATENT DOCUMENTS

| WO | 2005/019321 A2 | 3/2005 |
|---|---|---|
| WO | 2009/144495 A2 | 12/2009 |

OTHER PUBLICATIONS

Machine translation of JP 2008-214566, retrieved Oct. 15, 2016.*
Arkles, Barry, "Hydrophobicity, Hydrophilicity, and Silanes", Paint & Coatings Industry Magazine, vol. 22, No. 10, URL: http://www.gelest.com/goods/pdf/Library/advances/HydrophobicityHydrophilicityandSilanes.pdf, 10 Pages total, (2006).
Jonsson, Ulf, et al., "Chemical Vapour Deposition of Silanes", Thin Solid Films, vol. 124, No. 2, URL: http://www.sciencedirect.com/science/article/pii/0040609085902536, 2 Pages total, (Feb. 8, 1985) (Abstract only).
Glass, Nick R., et al., "Organosilane Deposition for Microfluidic Applications", Biomicrofluidics, vol. 5, 7 Pages total, (2011).

* cited by examiner

CRUMB RUBBER COATING WITH A HYDROPHOBIC SURFACE

BACKGROUND OF THE INVENTION

Technical Field

The present disclosure relates to a crumb rubber coating with a hydrophobic surface and a method of making the same.

Description of the Related Art

The "background" description provided herein is for the purpose of generally presenting the context of the disclosure. Work of the presently named inventors, to the extent it is described in this background section, as well as aspects of the description which may not otherwise qualify as prior art at the time of filing, is neither expressly nor impliedly admitted as prior art against the present invention.

Crumb rubber is a type of rubber material, typically extracted from automotive and truck scrap tires. During the recycling process, steel and fluff is removed, leaving tire rubber with a granular consistency. Continued processing with a granulator and/or cracker mill, often with the aid of cryogenics or mechanical means, reduces the size of the particles further. The particles are sized and classified based on various criteria, such as color ("black only" or "black and white"). The granulate is sized by passing it through a screen. The size is based on the dimension of the screen or on its mesh. Although recycling of scrap tires is highly desirable, the uses of crumb rubber have, thus far, been fairly limited. Crumb rubber is primarily used in artificial turf as cushioning, where it is sometimes referred to as "astro-dirt". Given the large volume of scrap tires around the world, and the need to conserve natural resources, as well as reducing pollutants, it would be desirable to provide further recycling uses for crumb rubber.

Typical commercially available coating products for piping and the like are either relatively hard, such as conventional epoxies and polyurethanes, or relatively expensive and difficult to apply, such as polysulfide and polyurea. Further, even the flexible, modified epoxies and polyurethanes lose their flexibility quickly as time elapses. It would be desirable to provide a flexible industrial coating, preferably with a hydrophobic surface to repel water and dust, for the protection of steel and concrete structures and other materials exposed to water and industrial chemicals, and to further provide such a coating that could utilize recycled crumb rubber.

Thus, it is an object of this disclosure to provide a crumb rubber coating, preferably a recycled crumb rubber coating, with a hyrdophobic surface and a method of making the same.

BRIEF SUMMARY OF THE INVENTION

According to a first aspect, the present disclosure relates to a recycled crumb rubber coating with a hydrophobic surface. The recycled crumb rubber coating with a hydrophobic surface includes a recycled crumb rubber coating layer comprising about 24-50 wt % of a crumb rubber, and about 25-75 wt % of an epoxy having a liquid epoxy resin:epoxy hardener ratio ranging from about 4:1 to about 1:1 by weight, wherein the crumb rubber is dispersed in the epoxy, and a first silane film comprising at least one silane and disposed on a surface of the recycled crumb rubber coating layer to form the hydrophobic surface of the recycled crumb rubber coating.

In one or more embodiments, a second silane film comprising at least one silane is disposed on a surface of the crumb rubber to render the surface of the crumb rubber hydrophobic.

In one or more embodiments, the surface of the recycled crumb rubber coating layer comprises the second silane film, or a portion of the second silane film, disposed on the surface of the crumb rubber, and the first silane film, or a portion of the first silane film, is disposed on the second silane film, or the portion of the second silane film.

In one or more embodiments, the silane is at least one selected from the group consisting of an alkoxysilane, a halosilane, an oximo silane, a methyl-substituted alkylsilane, a methylated medium chain alkyl silane, a fluorinated alkylsilane, a fluorinated long-chain alkyl silane, a polytetrafluoroethylene organosilane, and a trichloro (1H, 1H, 2H, 2H-perfluorooctyl) silane.

In one or more embodiments, the first silane film is a monolayered silane film.

In one or more embodiments, the hydrophobic surface has a water contact angle of at least about 150°.

In one or more embodiments, the crumb rubber is a mixture of powdered crumb rubber and mesh crumb rubber.

In one or more embodiments, the crumb rubber is a mixture consisting of 20-80% powdered crumb rubber and the balance being mesh crumb rubber.

In one or more embodiments, the liquid epoxy resin comprises a mixture of bisphenol A, bisphenol F, and epichlorohydrin.

In one or more embodiments, the epoxy hardener comprises at least one aliphatic polyamine hardener.

In one or more embodiments, the epoxy further comprises a viscosity reducing agent.

In one or more embodiments, a wt % of the viscosity reducing agent is about 0.5-3% by weight relative to the total weight of the liquid epoxy resin and the epoxy hardener.

In one or more embodiments, the viscosity reducing agent comprises benzyl alcohol.

According to a second aspect, the present disclosure relates to a method of making a recycled crumb rubber coating with a hydrophobic surface. The method includes (a) mixing a crumb rubber with a liquid epoxy resin to form a first mixture, (b) mixing the first mixture with an epoxy hardener to form a recycled crumb rubber coating layer, wherein the recycled crumb rubber coating layer comprises about 24-50 wt % of the crumb rubber, and about 25-75 wt % of the liquid epoxy resin and the epoxy hardener, wherein the weight ratio of the liquid epoxy resin:the epoxy hardener ranges from about 4:1 to about 1:1, and wherein the crumb rubber is dispersed in the liquid epoxy resin and the epoxy hardener, and (c) depositing a first silane film comprising at least one silane on a surface of the recycled crumb rubber coating layer to form the hydrophobic surface of the recycled crumb rubber coating.

In one or more embodiments, a second silane film comprising at least one silane is disposed on a surface of the crumb rubber in (a).

In one or more embodiments, the surface of the recycled crumb rubber coating layer comprises the second silane film, or a portion of the second silane film, disposed on the surface of the crumb rubber, and the depositing the first silane film in (c) comprises depositing the first silane film, or a portion of the first silane film, on the second silane film, or the portion of the second silane film.

In one or more embodiments, the first silane film deposited on the surface of the recycled crumb rubber coating layer is a monolayered silane film comprising the at least one silane, and the depositing comprises exposing the surface of the recycled crumb rubber coating layer to a vapor of the at least one silane under an anhydrous condition to form the hydrophobic surface comprising the monolayered first silane film.

In one or more embodiments, the depositing comprises exposing the surface of the recycled crumb rubber coating layer to a vapor of the at least one silane under an anhydrous condition and at a pressure of 1-500 mTorr to form the hydrophobic surface comprising the monolayered first silane film.

In one or more embodiments, the depositing comprises exposing the surface of the recycled crumb rubber coating layer to a vapor of the at least one silane under an anhydrous condition and at a temperature of 45-200° C. to form the hydrophobic surface comprising the monolayered first silane film.

In one or more embodiments, the method further comprises adding a viscosity reducing agent to the first mixture.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
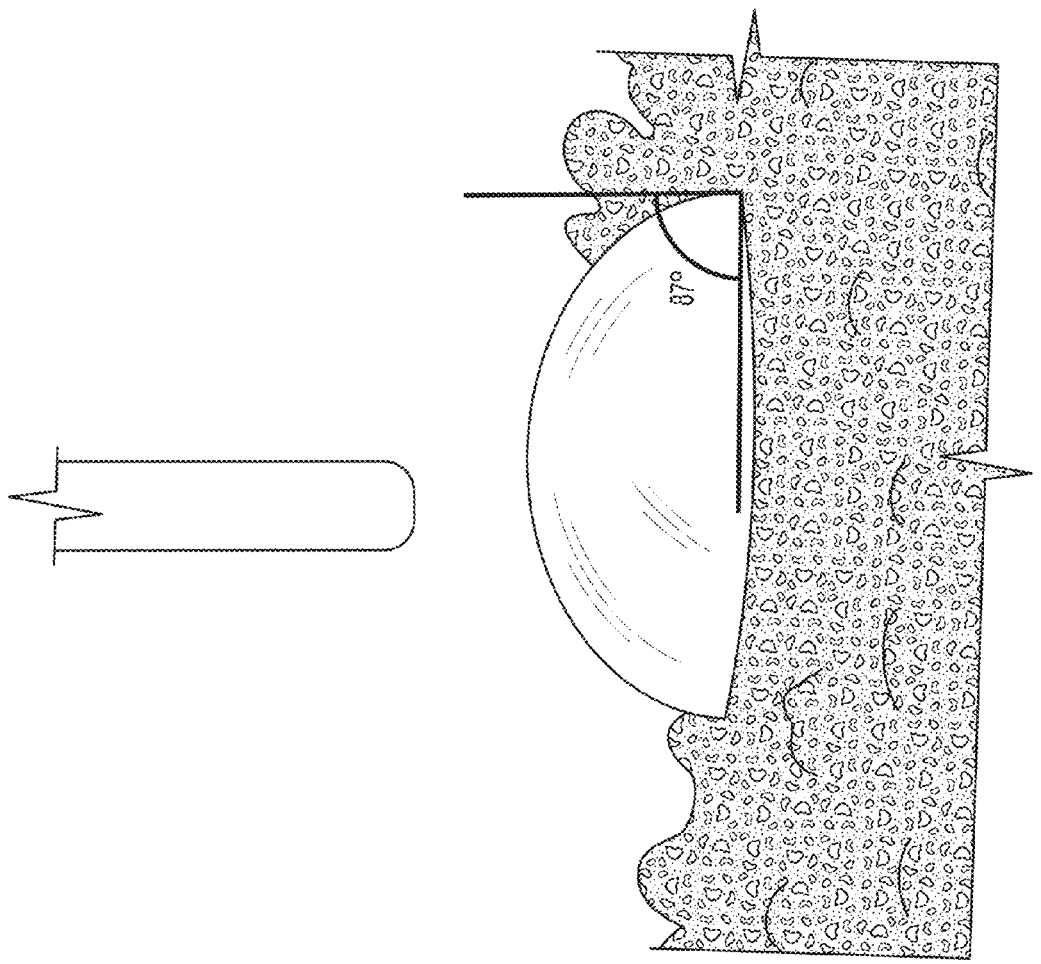
FIG. 1 is an illustration showing the measurement of the water contact angle on the surface of the recycled crumb rubber coating layer before the surface was treated with a silane.

The present disclosure relates to a crumb rubber coating, preferably a recycled crumb rubber coating, with a hydrophobic surface and a method for making the same. The recycled crumb rubber coating with a hydrophobic surface includes a recycled crumb rubber coating layer comprising about 24-50 wt % of a crumb rubber, and about 25-75 wt % of an epoxy having a liquid epoxy resin:epoxy hardener ratio ranging from about 4:1 to about 1:1 by weight, wherein the crumb rubber is dispersed in the epoxy, and a first silane film comprising at least one silane. The first silane film is disposed on a surface of the recycled crumb rubber coating layer to form the hydrophobic surface of the recycled crumb rubber coating. The method of making a recycled crumb rubber coating with a hydrophobic surface includes (a) mixing a crumb rubber with a liquid epoxy resin to form a first mixture, (b) mixing the first mixture with an epoxy hardener to form a recycled crumb rubber coating layer, wherein the recycled crumb rubber coating layer comprises about 24-50 wt % of the crumb rubber, and about 25-75 wt % of the liquid epoxy resin and the epoxy hardener, wherein the weight ratio of the liquid epoxy resin:the epoxy hardener ranges from about 4:1 to about 1:1, and wherein the crumb rubber is dispersed in the liquid epoxy resin and the epoxy hardener, and (c) depositing a first silane film comprising at least one silane on a surface of the recycled crumb rubber coating layer to form the hydrophobic surface of the recycled crumb rubber coating. The disclosed recycled crumb rubber coating with a hydrophobic surface is of low cost and easy to apply to a surface to be protected, and retain flexibility for longer times compared with conventional epoxies.

The crumb rubber coating layer, with the crumb rubber in the coating layer preferably being recycled crumb rubber typically extracted from automotive and truck scrap tires, is a corrosion or erosion-resistant coating for piping and the like. For example, as described in US patent application publication US2014/0316031 A1, incorporated herein by reference in its entirety, based on an erosion testing using an alumina impingement method, a recycled crumb rubber coating layer designated as Sample 4.3 and containing 50 wt % of a crumb rubber blend having 20 wt % powdered crumb rubber and 80 wt % mesh crumb rubber, with the balance being an epoxy has a low erosion rate of about 350 mg of the mass of the coating layer removed per g mass of the erodent at a particles feed rate of 2.5 g/min and at a temperature of 90° C. Besides piping, the crumb rubber coating layer, or preferably the recycled crumb rubber coating with a hydrophobic surface disclosed herein, may also be used to coat and protect the surface of wood, metal, glass, stone, and some plastics. The crumb rubber coating layer is formed from crumb rubber mixed with an epoxy resin and an epoxy hardener. In a preferred embodiment, a surface of the crumb rubber (particle) is treated with silane as described in detail below. Crumb rubber is first mixed with a liquid epoxy resin.

The liquid epoxy resin is preferably a mixture of bisphenol A, bisphenol F, and epichlorohydrin, such as D.E.R. 351, manufactured by Dow Chemical® of Midland, Mich. It should be understood that any suitable type of liquid epoxy resin may be utilized. In some embodiments, the crumb rubber and liquid epoxy resin are mixed for about one minute. In some embodiments, the crumb rubber or the recycled crumb rubber may be substituted by rubber of other types, either natural or synthetic, and/or from other sources, e.g. used or recycled rubber rain boots.

An agent for reducing the viscosity of the liquid epoxy resin, for example, without limitation, benzyl alcohol, cresyl glycidyl ether, butyl glycidyl ether, 1,4-butanediol diglycidyl ether, styrene oxide, xylene, propylene oxide, furfuryl alcohol, and d-limonene, may also be added. An epoxy hardener is then added to this mixture. The epoxy hardener is preferably an aliphatic polyamine hardener, non-limiting examples of which include diethylene triamine (DETA), triethylene pentamine (TETA), tetraethylene pentamine (TEPA), amino ethyl piperazine (AEP), Aradur® 2973 (Huntsman Advanced Materials, Switzerland), diproprenediamine (DPDA), diethylaminopropylamine (DEAPA), amine 248 (ThreeBond, West Chester, Ohio, USA), Lamiron C-260 (ThreeBond, West Chester, Ohio, USA), Araldit HY-964 (ThreeBond, West Chester, Ohio, USA), menthane diamine (MDA) (ThreeBond, West Chester, Ohio, USA), isophoronediamine (IPDA), S Cure 211 and S Cure 212 (ThreeBond, West Chester, Ohio, USA), wandamin HM (ThreeBond, West Chester, Ohio, USA), 1.3 BAC (ThreeBond, West Chester, Ohio, USA), m-xylenediamine (m-XDA), Sho-amine X (ThreeBond, West Chester, Ohio, USA), amine black (ThreeBond, West Chester, Ohio, USA), Sho-amine black (ThreeBond, West Chester, Ohio, USA), Sho-amine N (ThreeBond, West Chester, Ohio, USA), Sho-amine 1001 (ThreeBond, West Chester, Ohio, USA), and Sho-amine 1010 (ThreeBond, West Chester, Ohio, USA). It should be understood that any suitable type of epoxy hardener may be utilized. In some embodiments, the epoxy hardener, crumb rubber and liquid epoxy resin (and the viscosity reducing agent, if used) are stirred together for about 1-10 minutes, or preferably 2-8 minutes, or more preferably 3-5 minutes.

Powdered crumb rubber may be added after stirring the epoxy hardener, the crumb rubber and the liquid epoxy resin (and the viscosity reducing agent, if used) and mixed for about five minutes at atmospheric temperature to form the crumb rubber coating layer.

In some embodiments, the compositions of the recycled crumb rubber coating layer and the methods of making the same are the same as those disclosed in U.S. Pat. No. 8,853,303 B2 and US patent application publication US2014/0316031 A1, each herein incorporated by reference in its entirety.

In other embodiments, the crumb rubber coating layer comprises about 10-80 wt %, about 20-70 wt %, or preferably 24-50 wt % of a crumb rubber, and about 5-90 wt %, about 10-80 wt %, or preferably 25-75 wt % of an epoxy having a liquid epoxy resin:epoxy hardener ratio ranging from about 4:1 to about 1:1, preferably from about 3:1 to 1.5:1, or more preferably 2:1 by weight.

In some embodiments, the epoxy further comprises a viscosity reducing agent. In some embodiments, the viscosity reducing agent is included in an amount of about 0.5-3%, preferably about 1-2%, more preferably about 1% by weight of the total weight of the liquid epoxy resin and the epoxy hardener. The crumb rubber in the crumb rubber coating layer may be mesh crumb rubber, powdered crumb rubber (also called crumb rubber powder), or a combination of the two at various mass ratios without limitation. Mesh crumb rubber is defined as a coarse particulate crumb rubber having a particle size generally in the millimeter-size range, i.e., having at least one dimension greater than or equal to 1 mm, e.g. a particle size of 2-3 mm. Powdered crumb rubber or crumb rubber powder is defined as a fine particulate crumb rubber having a particle size in the micron range, i.e., less than 1 mm in every dimension, e.g. a particle size of 1-950 microns, 10-900 microns, 30-800 microns, preferably 50-700 microns, more preferably 70-600 microns, more preferably 90-500 microns, more preferably 100-400 microns, or more preferably 150-300 microns. In some embodiments, the crumb rubber in the crumb rubber coating layer is a mixture consisting of 10-90 wt %, preferably 20-80 wt %, preferably 30-70 wt %, preferably 40-60 wt %, or preferably 50 wt % powdered crumb rubber, with the balance being mesh crumb rubber.

In a preferred embodiment, the crumb rubber coating layer comprises about 24.0 wt % of a crumb rubber which is a mixture of about 20 wt % powdered crumb rubber and about 80 wt % mesh crumb rubber, with the balance being an epoxy having a liquid epoxy resin:epoxy hardener ratio of about 2:1 by weight.

In another preferred embodiment, the crumb rubber coating layer comprises about 23 wt % of a crumb rubber, and an epoxy that comprises about 51.6 wt % of a liquid epoxy resin and about 25.4 wt % of an epoxy hardener.

In still another preferred embodiment, the crumb rubber coating layer comprises about 23 wt % of a crumb rubber, and an epoxy that comprises about 50.1 wt % of a liquid epoxy resin, about 1.5 wt % of a viscosity reducing agent, and about 25.4 wt % of an epoxy hardener.

In a preferred embodiment, the liquid epoxy resin comprises a mixture of bisphenol A, bisphenol F, and epichlorohydrin. In another preferred embodiment, the epoxy hardener comprises at least one aliphatic polyamine hardener, preferably selected from diethylene triamine (DETA), triethylene pentamine (TETA), tetraethylene pentamine (TEPA), amino ethyl piperazine (AEP), Aradur® 2973 (Huntsman Advanced Materials, Switzerland), diproprenediamine (DPDA), diethylaminopropylamine (DEAPA), amine 248 (ThreeBond, West Chester, Ohio, USA), Lamiron C-260 (ThreeBond, West Chester, Ohio, USA), Araldit HY-964 (ThreeBond, West Chester, Ohio, USA), menthane diamine (MDA) (ThreeBond, West Chester, Ohio, USA), isophoronediamine (IPDA), S Cure 211 and S Cure 212 (ThreeBond, West Chester, Ohio, USA), wandamin HM (ThreeBond, West Chester, Ohio, USA), 1.3 BAC (ThreeBond, West Chester, Ohio, USA), m-xylenediamine (m-XDA), Sho-amine X (ThreeBond, West Chester, Ohio, USA), amine black (ThreeBond, West Chester, Ohio, USA), Sho-amine black (ThreeBond, West Chester, Ohio, USA), Sho-amine N (ThreeBond, West Chester, Ohio, USA), Sho-amine 1001 (ThreeBond, West Chester, Ohio, USA), and Sho-amine 1010 (ThreeBond, West Chester, Ohio, USA).

The crumb rubber coating layer may then be applied to an external surface of a substrate, such as a pipe, a structural element, or other materials (e.g. wood, metal, glass, stone, and plastics) by dipping, pouring, spraying, or by any other suitable method of application to form a coating. The coating layer is preferably applied and then left to dry. The resultant dried crumb rubber coating layer is relatively dark with a dark grey or black surface, flexible and resistant to cracking, and forms a relatively large thick film in a single coat. The thickness of the single coat may vary widely, depending on the application of the crumb rubber coating layer, the degree of protection for the substrate desired, etc., and may range from 0.2-5 cm, or preferably 0.5-3 cm, or more preferably 1-2 cm. The transmittance of the crumb rubber coating layer for light may vary, depending on the thickness of the coating layer, the type or wavelength of the light, the composition of the coating layer, etc. In some embodiments, the transmittance of the crumb rubber coating layer having a thickness of 5 mm for visible light with a wavelength of 380-700 nm, or for infrared light with a wavelength of 700 nm-1 mm, or for UV light with a wavelength of 10 nm-380 nm is less than 50%, less than 40%, less than 30%, less than 20%, less than 10%, or less than 5%. The coating is re-coatable, provides corrosion resistance against water and chemicals, has excellent mechanical and abrasion resistance, and a lifetime of about ten years or longer.

The crumb rubber coating layer may be further coated with a thin (on the order of about 30-50 microns) layer of acrylic or polyurethane paint for decorative purposes. Similarly, the thin layer of acrylic or polyurethane paint may be applied for protection against ultraviolet degradation.

Alternatively and preferably, following the application and drying of the crumb rubber coating layer on a substrate, e.g., an external surface of a pipe, a first silane film comprising at least one silane may be disposed on a surface of the crumb rubber coating layer to make the crumb rubber coating layer surface hydrophobic to repel water and dust, providing better corrosion protection of the surface of the substrate, e.g. pipelines and other structures. More preferably, during the preparation and formation of the crumb rubber coating layer, a second silane film may be disposed on a surface of the crumb rubber (particle) of the crumb rubber coating layer to make the surface of the crumb rubber (particle) hydrophobic. Then, the first silane film is disposed on the surface of the crumb rubber coating layer after the crumb rubber coating layer is applied to a substrate and dried.

Silanes play an important role in controlling the interaction of water with a surface. Silanes are silicon chemicals that possess a hydrolytically sensitive center that can react with inorganic substrates such as glass or organic substrates such as rubber to form stable covalent bonds and organic substitution that alters the physical interactions of treated substrates. Different from most additives, which have a limited performance range, silanes can achieve surface properties ranging from hydrophobic to hydrophilic. They may be a sole active ingredient or a component in a coatings formulation, controlling the interaction of water over a broad spectrum of requirements.

The crumb rubber and the epoxy resin of the crumb rubber coating layer contain hydroxyl groups capable of forming hydrogen bonds with water, rendering the surface of the crumb rubber coating layer polar and hydrophilic. A silane, preferably an organosilane with a non-polar organic substitution, can replace the hydrogens of hydroxyl groups by oxane bond formation, thus eliminating or mitigating the hydrogen bonding and shielding the polar surface of the crumb rubber coating layer from interaction with water by creating a non-polar interphase.

In one embodiment, the crumb rubber coating with a hydrophobic surface has a first silane film disposed on a surface of the crumb rubber coating layer. The resulting hydrophobic, preferably super-hydrophobic, surface of the crumb rubber coating layer forms the hydrophobic surface of the crumb rubber coating capable of repelling water and dust. The first silane film comprises at least one silane, which preferably is one or more organosilanes, more preferably one or more organosilanes with non-polar organic substitutions, more preferably with aliphatic hydrocarbon substituents or fluorinated hydrocarbon substituents. Non-limiting examples of suitable organosilanes for the first silane film include alkoxysilanes, halosilanes, and oximo silanes, more preferably methyl-substituted alkylsilanes, more preferably methylated medium chain alkyl silanes, more preferably fluorinated alkylsilanes, or more preferably fluorinated long-chain alkyl silanes, e.g. polytetrafluoroethylene organosilanes, such as trichloro (1H, 1H, 2H, 2H-perfluorooctyl) silane, that typically contain a short hydrocarbon chain followed by a long polyfluoro chain, producing surface fluoride groups that create hydrophobic surfaces.

In some embodiments, the first silane film covers at least 20%, at least 40%, preferably at least 50%, more preferably at least 70%, more preferably at least 80%, more preferably at least 90%, or more preferably at least 95% of the surface of the crumb rubber coating layer. In other embodiments, at least 20%, at least 40%, preferably at least 50%, more preferably at least 70%, more preferably at least 80%, more preferably at least 90%, or more preferably at least 95% of the hydroxyl groups on the surface of the crumb rubber coating layer are capped by (or reacted with) the silanes of the first silane film.

In another embodiment, the crumb rubber coating with a hydrophobic surface has a second silane film disposed on a surface of the crumb rubber (particle) to render the surface of the crumb rubber (particle) hydrophobic, in addition to the first silane film disposed on the surface of the crumb rubber coating layer. Like the first silane film, the second silane film comprises at least one silane preferably selected from one or more organosilanes, more preferably one or more organosilanes with non-polar organic substitutions, more preferably with aliphatic hydrocarbon substituents or fluorinated hydrocarbon substituents. Non-limiting examples of suitable organosilanes for the second silane film include alkoxysilanes, halosilanes, and oximo silanes, more preferably methyl-substituted alkylsilanes, more preferably methylated medium chain alkyl silanes, more preferably fluorinated alkylsilanes, or more preferably fluorinated long-chain alkyl silanes, e.g. polytetrafluoroethylene organosilanes, such as trichloro (1H, 1H, 2H, 2H-perfluorooctyl) silane. The silanes of the second silane film may be the same as the silanes of the first silane film, or may be different from the silanes of the first silane film, as long as the silanes of the second silane film change the surface of the crumb rubber (particle) from hydrophilic to hydrophobic, or preferably super-hydrophobic. In some embodiments, the second silane film covers at least 20%, at least 40%, preferably at least 50%, more preferably at least 70%, more preferably at least 80%, more preferably at least 90%, or more preferably at least 95% of the surface of the crumb rubber (particle). In other embodiments, at least 20%, at least 40%, preferably at least 50%, more preferably at least 70%, more preferably at least 80%, more preferably at least 90%, or more preferably at least 95% of the hydroxyl groups on the surface of the crumb rubber (particle) are capped by (or reacted with) the silanes of the second silane film.

In still another embodiment, the crumb rubber coating with a hydrophobic surface has the second silane film disposed on the surface of the crumb rubber (particle). The distribution of the crumb rubber particles in the crumb rubber coating layer is such that the surfaces of the crumb rubber particles covered with the second silane film constitute the entire or a portion of the crumb rubber coating layer surface. This can happen when the crumb rubber particles completely or partially occupy the surface of the crumb rubber coating layer. For example, when the crumb rubber coating layer is applied on a surface of a substrate and the surface of the crumb rubber coating layer defines the interface between the crumb rubber coating layer and the environment, and when the crumb rubber particles of the crumb rubber coating layer protrude from the basal plane of the interface, the surfaces of the crumb rubber particles may constitute the entire or a part of the crumb rubber layer surface interfacing with the environment, depending on the density of the crumb rubber particles on the crumb rubber coating layer surface, or the coverage of the crumb rubber coating layer surface by the crumb rubber particles. As a result, the first silane film disposed on the surface of the crumb rubber coating layer may be entirely or partially disposed on at least a portion of the second silane film disposed on the surfaces of the crumb rubber particles. In the above example, when the protruding crumb rubber particles completely occupy the crumb rubber coating layer surface, i.e. there is no gap between any two crumb rubber particles on the crumb rubber coating layer surface, the first silane film covering the crumb rubber coating layer surface will cover the portion of the second silane film on the protruding part of the surfaces of the crumb rubber particles. Alternatively, when the protruding crumb rubber particles partially occupy the crumb rubber coating layer surface, i.e. there is a gap between at least two crumb rubber particles on the crumb rubber coating layer surface, and the gap is filled by the non-crumb rubber components of the crumb rubber coating layer, e.g. the epoxy resin and/or the epoxy hardener, the first silane film covering the crumb rubber coating layer surface will cover the portion of the second silane film on the protruding part of the surfaces of the crumb rubber particles and surfaces of the non-crumb rubber components filling the gap. Having at least portions of the surface of the crumb rubber coating layer covered by two silane films, this embodiment of the crumb rubber coating with a hydrophobic surface may advantageously protect its underlying substrate with a stronger and/or longer-lasting hydrophobic surface.

In one embodiment, the first silane film disposed on the surface of the crumb rubber coating layer and/or the second silane film disposed on the surface of the crumb rubber (particle) are mono-layered. To deposit a mono-layered silane film on the surface of the crumb rubber coating layer and/or the surface of the crumb rubber (particle), mono-alkoxy-silanes, silanes with multiple organic substitutions, particularly substitutions involving phenyl or tertiary butyl groups, and/or polytetrafluoroethylene organosilanes, such as trichloro (1H, 1H, 2H, 2H-perfluorooctyl) silane, are preferably used, with the deposition preferably performed under anhydrous conditions, and/or the deposition being vapor phase deposition performed with extended reaction times, e.g. 0.5-48 hours, or 1-36 hours, preferably 3-24 hours, or preferably 4-16 hours, preferably in low vacuum, e.g. 25-760 Torr, or 25-400 Torr, or 25-200 Torr, more preferably in medium vacuum, e.g. 1 mTorr-25 Torr, or 1 mTorr-10 Torr, or 1 mTorr-1 Torr, or 1 mTorr-500 mTorr, or 1 mTorr-100 mTorr, and/or at elevated temperatures, e.g. 45-200° C., or 70-150° C., or 90-120° C.

In some embodiments, the monolayered first and/or second silane films are deposited on the surface of the crumb rubber coating layer and/or the surface of the crumb rubber (particle) by exposing the surface of the crumb rubber coating layer and/or the surface of the crumb rubber (particle) to a solution of organosilanes, for example, by submerging of the crumb rubber coating layer and/or the crumb rubber particles into a solution of organosilanes. Common solvents for the organosilanes are toluene, benzene with hexane, acetone, anhydrous ethanol, or mixtures of these. The concentrations of organosilanes and the deposition time may vary depending on the organosilanes and the solvents used, the composition of the crumb rubber coating layer and/or the crumb rubber particles which determine the abundance of the hydroxyl groups and thus the hydrophilicity of their respective surfaces, the surface area of the crumb rubber coating layer and/or the crumb rubber particles to be treated, etc. For example, if octadecyltrimethoxysilane (OTMS) or octadecyltrichlorosilane (OTS) dissolved in toluene, hexane, or cyclohexane is used to treat a surface of the crumb rubber coating layer or the crumb rubber (particle), the concentration of OTMS or OTS may range from 1-100 mM, or 10-90 mM, or 20-60 mM, and the deposition time may range from 1 min to 24 h, or 1-24 h, or 4-16 h. If polytetrafluoroethylene organosilanes (PFS) dissolved in iso-octane or toluene is used, the concentration of PFS may range from 100 uM to 5 mM, and the deposition time may range from 10 min to overnight. Solution deposition is often used due to the simplicity of the method and low setup cost. However, the monolayer quality is very sensitive to the amount of water in the system. If there is not enough, only a partial monolayer forms, while if there is too much water the organosilanes may polymerize, the silane film formed may be unstable, and/or the surface property may be inconsistent.

In a preferred embodiment, the monolayered first and/or second silane films are deposited on the surface of the crumb rubber coating layer and/or the surface of the crumb rubber (particle) by exposing the surface of the crumb rubber coating layer and/or the surface of the crumb rubber (particle) to a vapor of organosilanes (i.e. chemical vapor deposition). This process relies on increasing the partial pressure of the organosilanes within a closed system, achieved either by heating a closed container or by lowering the base pressure using a vacuum pump with an open source of liquid organosilanes inside. The organosilanes are then deposited via chemisorption. For example, the crumb rubber coating layer and/or the crumb rubber particles and the organosilane liquid solution may be placed in a vacuum chamber or a desiccator and the pressure of the system may be pumped down to approximately 1 mTorr-400 Torr, or preferably 1 mTorr-200 Torr, or more preferably 1 mTorr-1 Torr, or more preferably 1-500 mTorr. The crumb rubber coating layer and/or the crumb rubber particles may be exposed to the organosilane vapor for 0.5-48 h, preferably 1-36 h, or more preferably 3-24 h, allowing the organosilanes to chemically adsorb onto the surface of the crumb rubber coating layer and/or the surface of the crumb rubber (particle). After the completion of the vapor deposition, the chamber is vented and the un-adsorbed organosilanes are disposed of. Alternatively, the surface of the crumb rubber coating layer and/or the surface of the crumb rubber (particle) may be exposed to the organosilane vapor generated at an elevated temperature of, for example, 45-200° C., or preferably 70-150° C., or 90-120° C.

In another embodiment, the first silane film disposed on the surface of the crumb rubber coating layer and/or the second silane film disposed on the surface of the crumb rubber (particle) are multi-layered or poly-layered. The multilayers of silanes may be either inter-connected through a loose network structure, or intermixed, or both. To generate a multi-layered silane film, silanes with three alkoxy groups are preferably used. Depositing a multilayered first silane film on the surface of the crumb rubber coating layer and/or a multi-layered second silane film on the surface of the crumb rubber (particle) may be achieved by the above mentioned solution deposition method, preferably with an aqueous solution of silanes (since water leads to hydrolysis and polymerization of silanes), by repeated vapor deposition, by repeated solution deposition, or by repeated vapor and solution depositions. Besides immersing the crumb rubber coating layer and/or the crumb rubber particles in a silane containing solution, variations of the above mentioned solution deposition method include spraying, dipping, brushing, or wiping to apply a silane containing solution, preferably an aqueous solution, onto the surface of the crumb rubber coating layer and/or the surface of the crumb rubber (particle).

Additionally, depositing a multilayered first silane film on the surface of the crumb rubber coating layer and/or a multilayered second silane film on the surface of the crumb rubber (particle) may be achieved by applying to the surface of the crumb rubber coating layer and/or the surface of the crumb rubber (particle) the silane-containing compositions according to International Application Publication No. WO2009144495A2 and International Application Publication No. WO2005019321A2, each incorporated herein by reference in its entirety.

In still another embodiment, the method of making a (recycled) crumb rubber coating with a hydrophobic surface may comprise:

(a) depositing a mono-layered or multi-layered second silane film comprising at least one silane on a surface of a crumb rubber (particle), preferably a recycled crumb rubber (particle), which can be a mesh crumb rubber (particle), a powdered crumb rubber (particle), or a mixture of a mesh crumb rubber (particle) and a powdered crumb rubber (particle), to make the surface of the crumb rubber (particle) hydrophobic. The deposition of the second silane film may be performed by any one or combinations of the deposition techniques mentioned above, which include solution deposition and vapor deposition;

(b) mixing the crumb rubber (particle) covered with the second silane film with a liquid epoxy resin to form a first mixture; and (c) mixing the first mixture with an epoxy hardener, optionally also with a viscosity reducing agent, to form the (recycled) crumb rubber coating layer comprising the crumb rubber (particle) covered with the second silane film, and (d) depositing a first silane film comprising at least one silane on a surface of the (recycled) crumb rubber coating layer to form the hydrophobic surface of the recycled crumb rubber coating.

In the implementation of (b) and (c) of this embodiment of the method, the proportions of the crumb rubber (particle), the liquid epoxy resin, the epoxy hardener, and the viscosity reducing agent if used, may be the same as or similar to those for making the crumb rubber coating layer using the non-silane treated crumb rubber (particle) described above. Following (c), if the distribution of the crumb rubber particles covered with the second silane film in the crumb rubber coating layer results in the surfaces of the crumb rubber particles constituting the entire or a portion of the crumb rubber coating layer surface as described above, depositing the first silane film on the surface of the crumb rubber coating layer in (d) comprises depositing the first silane film on the second silane film, or a portion of the second silane film, giving rise to the formation of the crumb rubber coating with at least portions of the surface of the crumb rubber coating layer covered by two silane films.

The mono-layered or multi-layered character of the first and/or the second silane films may be determined by scanning electron microscopy.

A simple, quantitative method for defining a relative degree of interaction of a liquid with a solid surface is the contact angle of a liquid droplet on a solid substrate. If the liquid is water and the contact angle is less than 30°, the surface is designated hydrophilic since the forces of interaction between water and the surface nearly equal the cohesive forces of bulk water, and water does not cleanly drain from the surface. On a hydrophobic surface, water forms distinct droplets. As the hydrophobicity increases, the contact angle of the droplets with the surface increases. Surfaces with water contact angles greater than 90° are designated as hydrophobic. Surfaces with water contact angles greater than 150° are designated as super-hydrophobic. In some embodiments, the hydrophobic surface of the crumb rubber coating has a water contact angle of at least about 90°, at least about 110°, at least about 120°, at least about 130°, at least about 140°, at least about 150°, at least about 160°, or at least about 170°.

Example 1

Preparation of the Recycled Crumb Rubber Coating Layer

Crumb rubber was manually mixed with DER351 (a liquid epoxy resin), optionally also with benzyl alcohol (to reduce the viscosity of the liquid epoxy resin), for one minute. An epoxy hardener (Aradur® 2973) was then added manually, and the mixture containing the epoxy hardener, crumb rubber and liquid epoxy resin (and the viscosity reducing agent, e.g. benzyl alcohol, if used) was stirred for three minutes. Finally, additional crumb rubber was added and mixed for about five minutes at atmospheric temperature to form the recycled crumb rubber coating layer. Benzyl alcohol formed about 1.5 wt. % of the total weight of the recycled crumb rubber coating layer.

The recycled crumb rubber coating layer may then be applied manually on a surface of a substrate, such as an external surface of a pipe and a surface of glass, either by dipping, pouring, or spraying, and left to dry, for example, for 3 hours. The resulting dried coating layer was opaque and dark in color, with a dark grey or black surface. After that, a surface of the recycled crumb rubber coating layer can be modified to make it hydrophobic according to the following example.

Example 2

Hydrophobic Surface Modification of the Recycled Crumb Rubber Coating Layer with Trichloro (1H, 1H, 2H, 2H-Perfluorooctyl) Silane The hydrophobic or hydrophilic property of a surface may be modified either by roughening or by adding a layer of a polymeric material like silane. Surface modification of the recycled crumb rubber coating layer with a silane does not affect the surface morphology or the characteristics of the coating layer. A monolayer of silane was deposited on a surface of the recycled crumb rubber coating layer to reduce the surface energy dramatically and to effect super hydrophobicity on the initially rough surface of the coating layer. The following is the salinization procedure for the surface of the recycled crumb rubber coating layer.

Figure 2:
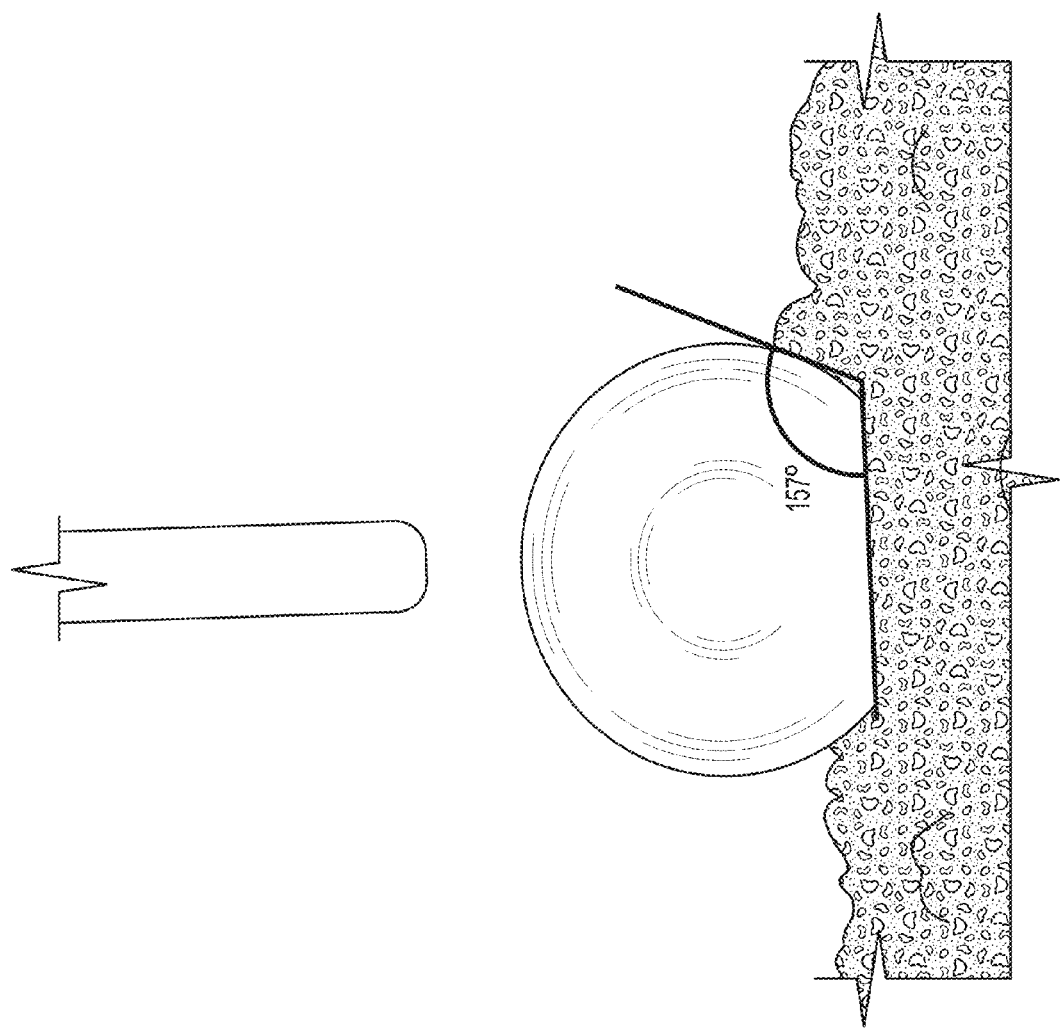
FIG. 2 is an illustration showing the measurement of the water contact angle on the surface of the recycled crumb rubber coating layer after the surface was treated with a silane.

The recycled crumb rubber coating layer was applied on a surface of a glass slide. Then, the hydrophilic surface of the recycled crumb rubber coating layer was modified using trichloro (1H, 1H, 2H, 2H-perfluorooctyl) silane. To deposit a monolayered film of trichloro (1H, 1H, 2H, 2H-perfluorooctyl) silane on the surface of the recycled crumb rubber coating layer, a few drops of trichloro (1H, 1H, 2H, 2H-perfluorooetyl) silane were deposited on a glass side. The glass slide with trichloro (1H, 1H, 2H, 2H-perfluorooctyl) silane and the glass slide coated with the recycled crumb rubber coating layer were placed side by side in the chamber of a desiccator. The desiccator was closed tightly and evacuated with a vacuum pump. A surface of the recycled crumb rubber coating layer was exposed to the trichloro (1H, 1H, 2H, 2H-perfluorooctyl) silane vapor inside the sealed and evacuated desiccator for at least 24 hours. All of the above mentioned procedures were done inside a fume hood due to the toxicity of trichloro (1H, 1H, 2H, 2H-perfluorooctyl) silane. The desiccator was vented after 24 hours and the silane-treated recycled crumb rubber coating layer was collected for water contact angle analysis. Referring to FIG. 1, prior to the salinization procedure, the contact angle of water on the surface of the recycled crumb rubber coating layer was 87°. Referring to FIG. 2, after the salinization procedure, the contact angle of water on the surface of the recycled crumb rubber coating layer was increased to 157°. Thus, the surface of the recycled crumb rubber coating layer had changed from hydrophilic to super-hydrophobic. Thus, the inventive recycled crumb rubber coating with a hydrophobic surface exhibits an advantageous super-hydrophobic surface characteristic in addition to the previously disclosed characteristics associated with the non-surface modified recycled crumb rubber coating layer, such as resistance to corrosion and erosion and good hardness readings. All these advantageous properties make the recycled crumb rubber coating with a hydrophobic surface of the present disclosure a competitive candidate to replace conventional coating for many novel applications in different industries.

The invention claimed is:

1. A recycled crumb rubber coating with a hydrophobic surface, comprising:
   a recycled crumb rubber coating layer comprising
      about 24-50 wt % of a crumb rubber,
      a second silane film consisting of a 1H, 1H, 2H, 2H-perfluorooctyl silane that covers the recycled crumb rubber, and
      about 25-75 wt % of an epoxy having a liquid epoxy resin:epoxy hardener ratio ranging from about 4:1 to about 1:1 by weight,
      wherein the crumb rubber is covered with the second silane film prior to being dispersed in the epoxy, and
   a first silane film consisting of a 1H, 1H, 2H, 2H-perfluorooctyl silane, wherein, after forming the recycled crumb rubber coating layer, the first silane film is disposed on a surface of the recycled crumb rubber coating layer to form the hydrophobic surface of the recycled crumb rubber coating.

2. The recycled crumb rubber coating with a hydrophobic surface of claim 1, wherein the surface of the recycled crumb rubber coating layer comprises a portion of the second silane film and wherein a portion of the first silane film, is disposed on the portion of the second silane film.

3. The recycled crumb rubber coating with a hydrophobic surface of claim 1, wherein the first silane film is a monolayered silane film.

4. The recycled crumb rubber coating with a hydrophobic surface of claim 1, wherein the hydrophobic surface has a water contact angle of at least about 150°.

5. The recycled crumb rubber coating with a hydrophobic surface of claim 1, wherein the crumb rubber is a mixture of powdered crumb rubber and mesh crumb rubber.

6. The recycled crumb rubber coating with a hydrophobic surface of claim 5, wherein the crumb rubber is a mixture consisting of 20-80% powdered crumb rubber and the balance being mesh crumb rubber.

7. The recycled crumb rubber coating with a hydrophobic surface of claim 1, wherein the liquid epoxy resin comprises a mixture of bisphenol A, bisphenol F, and epichlorohydrin.

8. The recycled crumb rubber coating with a hydrophobic surface of claim 1, wherein the epoxy hardener comprises at least one aliphatic polyamine hardener.

9. The recycled crumb rubber coating with a hydrophobic surface of claim 1, wherein the epoxy further comprises a viscosity reducing agent.

10. The recycled crumb rubber coating with a hydrophobic surface of claim 9, wherein a wt % of the viscosity reducing agent is about 0.5-3% by weight relative to the total weight of the liquid epoxy resin and the epoxy hardener.

11. The recycled crumb rubber coating with a hydrophobic surface of claim 9, wherein the viscosity reducing agent comprises benzyl alcohol.

12. The recycled crumb rubber coating with a hydrophobic surface of claim 1, wherein at least 95% of the recycled crumb rubber surface is coated with the second silane film.

13. A method of making the recycled crumb rubber coating with a hydrophobic surface of claim 1, comprising:
   (a) depositing the second silane film onto the crumb rubber and mixing the crumb rubber covered with the second silane film with the liquid epoxy resin to form a first mixture,
   (b) mixing the first mixture with the epoxy hardener to form the recycled crumb rubber coating layer, and
   (c) depositing the first silane film consisting of the 1H, 1H, 2H, 2H-perfluorooctyl silane on a surface of the recycled crumb rubber coating layer to form the hydrophobic surface of the recycled crumb rubber coating.

14. The method of claim 13, wherein the surface of the recycled crumb rubber coating layer comprises a portion of the second silane film and wherein a portion of the first silane film is deposited in (c) onto the portion of the second silane film.

15. The method of claim 13, wherein the first silane film deposited on the surface of the recycled crumb rubber coating layer is a monolayered silane film consisting of the 1H, 1H, 2H, 2H-perfluorooctyl silane, and wherein the depositing comprises exposing the surface of the recycled crumb rubber coating layer to a vapor of the 1H, 1H, 2H, 2H-perfluorooctyl silane under an anhydrous condition to form the hydrophobic surface comprising the monolayered first silane film.

16. The method of claim 15, wherein the depositing comprises exposing the surface of the recycled crumb rubber coating layer to a vapor of the 1H, 1H, 2H, 2H-perfluorooctyl silane under an anhydrous condition and at a pressure of 1-500 mTorr to form the hydrophobic surface comprising the monolayered first silane film.

17. The method of claim 15, wherein the depositing comprises exposing the surface of the recycled crumb rubber coating layer to a vapor of the 1H, 1H, 2H, 2H-perfluorooctyl silane under an anhydrous condition and at a temperature of 45-200° C. to form the hydrophobic surface comprising the monolayered first silane film.

18. The method of claim 13, further comprising adding a viscosity reducing agent to the first mixture.

* * * * *